United States Patent [19]

Honore et al.

[11] Patent Number: 5,272,596
[45] Date of Patent: Dec. 21, 1993

[54] PERSONAL DATA CARD FABRICATED FROM A POLYMER THICK-FILM CIRCUIT

[75] Inventors: Jack P. Honore, Trenton; Fred W. Verdi, Lawrenceville, both of N.J.

[73] Assignee: AT&T Bell Laboratories, Murray Hill, N.J.

[21] Appl. No.: 720,130

[22] Filed: Jun. 24, 1991

[51] Int. Cl.⁵ .................................................. H05K 1/11
[52] U.S. Cl. ...................................... 361/633; 29/846; 29/850; 235/488; 174/257; 428/901
[58] Field of Search ................... 29/846, 850; 235/488, 235/492; 174/256-259; 361/400, 408, 414; 428/901

[56] References Cited

U.S. PATENT DOCUMENTS

| | | | |
|---|---|---|---|
| 3,637,994 | 1/1972 | Ellingboe | 235/61.12 |
| 4,222,516 | 9/1980 | Badet et al. | 235/492 |
| 4,417,413 | 11/1985 | Hoppe et al. | 40/630 |
| 4,603,249 | 7/1986 | Hoppe et al. | 235/492 |
| 4,649,418 | 3/1987 | Uden | 357/80 |
| 4,692,604 | 9/1987 | Billings | 235/493 |
| 4,746,392 | 5/1988 | Hoppe | 156/244 |
| 4,764,803 | 8/1988 | Ueda | 357/72 |
| 4,849,617 | 7/1989 | Ueda | 235/492 |
| 4,921,160 | 5/1990 | Flynn et al. | 235/492 |

FOREIGN PATENT DOCUMENTS 2595848 3/1987 France .
58-210646 12/1983 Japan .
61-145696 7/1986 Japan .

OTHER PUBLICATIONS

B. Jones, "Polymer Thick Film Technology Review," Sales Brochure, TACL Mfg., McLean, Va. 22101, 1991.
K. Gilleo, "The Polymer Electronics Revolution," presented at NEPCON West '92, Proceedings of the Technical Program—*National Electronic Packaging and Production Conference,* vol. 3, pp. 1390–1401, 1992.
K. Gilleo, "PTF, SMT and FLEX, a Winning Combination, presented at NEPCON West '87, Proceedings of the Technical Program"—*National Electronic Packaging and Production Conference,* vol. 1, pp. 223–229, 1987.

Primary Examiner—P. W. Echols
Attorney, Agent, or Firm—Robert B. Levy

[57] ABSTRACT

A personal data card (10) is fabricated from a polymer thick-film circuit (12) formed of a polymer sheet (14) having a plurality of pads (16 and 17) and interconnecting paths (18) printed thereon with a copper-filled polymer ink. Each of a selected set of the pads (16) has a layer of nickel (22) applied to it, and then a layer of gold (24) applied above the nickel, to facilitate wire bonding of each of a plurality of aluminum leads (21), associated with a semiconductor die (19), to a corresponding pad. Use of such a polymer thick-film circuit (12) in the fabrication of the data card (10) reduces the cost of the card.

13 Claims, 1 Drawing Sheet

PERSONAL DATA CARD FABRICATED FROM A POLYMER THICK-FILM CIRCUIT

TECHNICAL FIELD

This invention relates to an electronic memory-type personal data card which is fabricated from a polymer thick-film circuit.

BACKGROUND OF THE INVENTION

Presently, there is much effort being devoted towards the development of a personal data card which is a credit-card-sized device containing an electronic memory for storing data in electronic form. An example of such a personal data card is described in U.S. Pat. No. 4,921,160, issued on May 1, 1990, in the names of Richard Flynn and Fred Verdi, and assigned to AT&T. In the past, personal data cards have been fabricated from a conventional circuit board, made from FR-4 or a polyester resin, which has a layer of metallization of copper or the like clad to one or both of its major surfaces. The copper metallization is patterned, typically by photolithographic techniques, to yield a circuit comprised of a plurality of metallized pads and conductive paths selectively interconnecting the pads. In practice, the metallized pads are selectively plated first with nickel and then gold to facilitate wire bonding of each of a plurality of aluminum leads of a semiconductor die to the circuit board.

While the use of FR-4 or polyester resin-based circuit boards in the fabrication of personal data cards is widespread, the cost of such circuit boards often represents a sizable fraction of the overall cost of the card itself. For this reason, efforts have been focused on employing a less expensive interconnection media in the fabrication of a personal data card. One type of interconnection media which offers a cost advantage over conventional FR-4 and polyester resin-based circuit boards is a polymer thick-film circuit. Such circuits are typically comprised of a sheet of polymer (e.g., MYLAR® film) having a conductive ink printed thereon to yield a pattern of conductive pads and interconnecting paths. Connection of a component to a set of the electrically conductive ink pads on the polymer thick-film circuit is accomplished either by soldering or by use of a conductive adhesive.

While polymer thick-film circuits are less expensive to fabricate than conventional FR-4 and polyester resin-based circuit boards, such thick-film circuits have not replaced conventional circuit boards in the fabrication of personal data cards. One reason why is that, heretofore, it has not been possible to make a reliable wire bond between each aluminum lead, associated with a semiconductor die, and an ink pad on a polymer thick-film circuit. Wire bonding is the preferred technique for reliably achieving an electrical connection between each semiconductor die and the interconnection media in fabricating a personal data card because of the fine pitch of the aluminum leads associated with the die.

Further, with present-day polymer thick-film circuits, the conductive pads and interconnecting paths, created by depositing conductive ink onto the polymer film, have an impedance which is thought to be suitable only for dc circuits found in contact-type personal data cards. As their name implies, contact-type cards have a set of electrical contacts designed for physical mating with a corresponding set of contacts on a corresponding card reader, thus allowing dc to be coupled t the card directly to power the active components on the card. On the other hand, the impedance of the conductive ink paths and interconnecting pads on current-day polymer thick-film circuits is generally regarded as being too high for ac circuits found in contactless personal data cards. Contactless personal data cards are characterized by an absence of any contacts for physically making connection to a card reader. Instead, present-day contactless cards generally are provided with inductive and/or capacitive coupling means for coupling signals and power to the card. As may be appreciated, with contactless-type personal data cards, the dc needed to power active components on the card must be generated on the card itself from the ac coupled thereto. Hence, contactless cards carry one or more ac circuits not found on contact-type cards.

SUMMARY OF THE INVENTION

Briefly, in accordance with the invention there is disclosed a personal data card, typically of the contactless variety, which is fabricated from a polymer thick-film circuit. The polymer thick-film circuit is comprised of a sheet of polymer film on which a copper-loaded polymer ink is deposited to establish a pattern of electrically conductive pads and interconnecting conductive paths. Nickel is applied, typically by electroless plating, to selected pads on the thick-film circuit before such pads are plated with gold. The gold on each selectively plated pad facilitates wire bonding of an aluminum lead, associated with a semiconductor die, to the polymer thick-film circuit, while the nickel underlying the gold imparts enough rigidity to the gold to assure sufficient deformation of the lead for reliable bonding. The copper-loaded polymer ink deposited on the thick-film circuit yields a circuit having a sufficiently low impedance for ac circuits generally found on a contactless card. Moreover, the resistance of the ink was found to be lowered when the polymer thick-film circuit was laminated to other layers during subsequent fabrication of the personal data card, thus improving the card's electrical performance.

DETAILED DESCRIPTION

Figure 1:
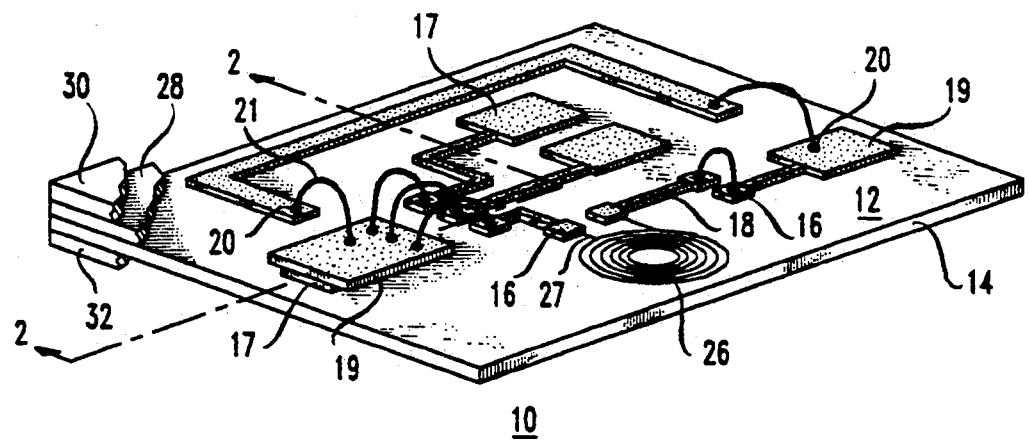
FIG. 1 is a perspective view of a contactless personal data card constructed in accordance with the present invention.

FIG. 1 is a perspective of a contactless-type personal data card 10 constructed in accordance with the present invention. The card 10 is fabricated from a polymer thick-film circuit 12 comprised of a sheet 14 of polymer film (e.g., MYLAR® film) approximately 1-2 mils thick. The actual thickness of the sheet 14 has been exaggerated for purposes of illustration. A pattern of pads 16 and 17 and interconnecting paths 18 is printed on the film 14 using a copper-filled polymer ink so that the pads and connecting paths, upon curing, are electrically conductive. Typically, the pads 16 and 17 and the paths 18 are printed so as to be approximately 1 mil thick, which renders them sufficiently conductive for carrying both dc and ac current with acceptable losses.

The pads 16 are relatively small in size (typically 50×50 mils) and serve as bond sites for leads associated with a semiconductive die, as well as for leads of discrete passive components, as will be discussed hereinafter. For this reason, the pads 16 will hereinafter be referred to as "bond-site" pads. The pads 17 are made large (up to 0.375"×0.375") so that two or more can serve as capacitive plates for coupling data to the card 10 while others serve to seat a separate one of a plurality of semiconductor dies 19 which are typically secured to the film 14 by an adhesive. Typically, one of the dies 19 comprises a combined microprocessor and memory device while another die comprises an analog device for controlling signal flow, and for supplying dc power to the microprocessor and memory device.

Figure 2:
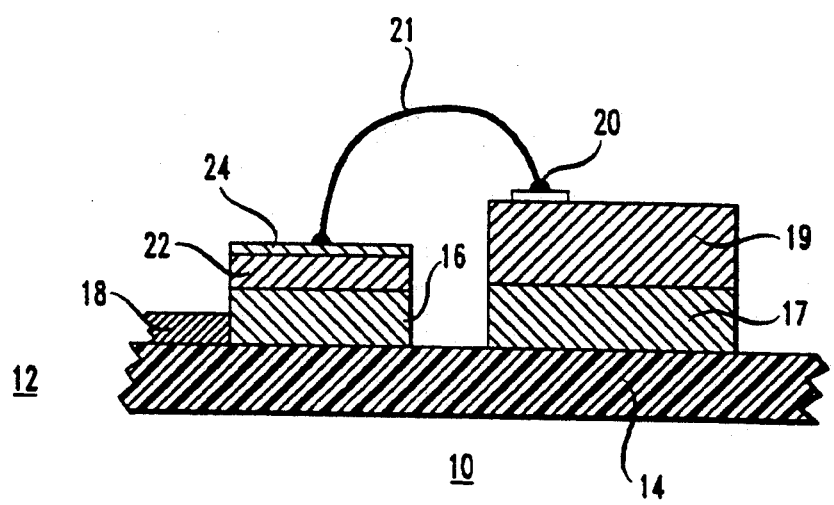
FIG. 2 is a cross-sectional view of the personal data card of FIG. 1 taken along the plane 2—2 thereof.

Referring to FIG. 2, each die 19 has a plurality of contacts 20 (only one shown) on its upper surface, each contact being electrically wire bonded to one end of an aluminum lead 21 whose opposite end is wire bonded to a corresponding bond-site pad 16. To facilitate a wire bond between each aluminum lead 21 and a corresponding bond-site pad 16 on the polymer sheet 14, each such bond-site pad has a layer 22 of nickel, approximately 300 microns thick, applied thereto. Typically, the layer 22 of nickel is applied by electroless plating. Above the nickel layer 22 is a layer 24 of gold approximately 10-20 μm thick, which is also typically applied by electroless plating.

The gold layer 24 serves as the medium to which the aluminum lead 21 is bonded. However, when the gold layer 24 was applied directly to a bond-site pad 16, applicants discovered that the gold layer was simply too soft to sufficiently deform the aluminum lead 21 to effect a reliable bond. By applying the nickel layer 22 to the bond-site 16 below the gold layer 24, the nickel, which is far harder, and is plated far thicker than the gold layer, acts to make the latter "infinitely" thick. In this way, the gold layer 24 is rendered sufficiently hard to deform the aluminum lead 21 bonded to it to effect a reliable bond.

In addition to the semiconductor dies 19, the personal data card 10 further comprises a coil 26 which may take the form of a flexible, wound inductive device, as described in U.S. Pat. No. 4,692,604, issued in the name of R. L. Billings, and assigned to AT&T Bell Labs, or a disc coil. Typically, the coil 26 is secured to the film 14 by way of double-sided tape or an adhesive. An electrical connection between each of a pair of leads 27 of the coil 26 and each of a pair of bond-site pads 16 may be made via solder or via a conductive adhesive. The coil 26 serves as a secondary of a transformer to couple ac into the card 10 from a primary coil (not shown) placed in proximity thereto. The primary coil would typically reside in a card reader/writer device (not shown). Although not shown, the card 10 may further include one or more discrete passive components, i.e., a capacitor, bonded to the film 14 by an electrically conductive adhesive.

The polymer sheet 14 is made stiff by laminating a stiffening layer 28 (only a portion of which is shown) to the upper major surface of the film 14. The stiffening layer 28 is typically made from a polyester resin and is provided with individual cutouts (not shown) to accommodate each of the semiconductor dies 19 and the coil 26 as well as any discrete components. In practice, the stiffening layer 28 is laminated to the film 14 prior to the attachment of the dies 19, the coil 26, and any discrete components to the film. Once the stiffening layer 28 is laminated to the film 14, and the dies 19, the coil 26, and the discrete components are attached and electrically connected, a quantity of epoxy potting compound (not shown) is admitted into each of the cutouts in the stiffening layer 28.

The epoxy is then cured, and thereafter, front and back labels 30 and 32 are laminated to the upper major surface of the stiffening layer 28 and to the bottom surface of the film 14, respectively, thus completing the fabrication of the personal data card 10. An advantage of fabricating the personal data card 10 in this fashion is that by laminating the layer 28 and the labels 30 and 32 to the film 14, the pads 16 and 17 and the paths 18 are compressed, which further reduces their impedance, which is very desirable.

The foregoing describes a personal data card 10 fabricated from a polymer thick-film circuit 12 comprised of a film 14 patterned with copper-filled polymer ink which is selectively plated with nickel and then gold to advantageously facilitate wire bonding of semiconductor dies 19 thereto.

It is to be understood that the above-described embodiments are merely illustrative of the principles of the invention. Various modifications and changes may be made thereto by those skilled in the art which will embody the principles of the invention and fall within the spirit and scope thereof.

We claim:

1. A method for fabricating a personal card comprising the steps of:
    forming a polymer thick-film circuit by printing a pattern of conductive pads and interconnecting paths on a polymer film with a conductive ink;
    applying a layer of nickel to selected pads on the film;
    applying a layer of gold above the nickel layer on said selected pads;
    wire bonding each of a plurality of leads associated with at least one semiconductor die to a corresponding one of said selected pads to which nickel and then gold is applied; and
    laminating at least one additional layer to the film.

2. The method according to claim 1 wherein the nickel is applied to said selected pads by electroless plating.

3. The method according to claim 1 wherein the gold is applied to the nickel on said selected pads by electroless plating.

4. The method according to claim 1 wherein a stiffening layer is laminated to a first surface of the polymer film and a front and back label are each laminated to the stiffening layer and to the film, respectively.

5. The method according to claim 1 further including the step of attaching a coil to the film and connecting each of the pair of leads of the coil to a corresponding one of a pair of conductive pads on the film.

6. A personal data card fabricated by the steps of:
    forming a polymer thick-film circuit by printing a pattern of conductive pads and interconnecting paths on a polymer film with a conductive ink;
    applying a layer of nickel to selected pads on the film;
    applying a layer of gold above the nickel layer on said selected pads;
    wire bonding each of a plurality of leads associated with at least one semiconductor die to a corresponding one of said selected pads to which nickel and then gold is applied; and
    laminating at least one additional layer to the film.

7. The data card according to claim 1 wherein the nickel is applied to said selected pads by electroless plating.

8. The data card according to claim 6 wherein the gold is applied to the nickel on said selected pads by electroless plating.

9. The data card according to claim 6 wherein a stiffening layer is laminated to a first surface of the polymer film, and front and back labels are each laminated to the stiffening layer and to the film, respectively.

10. A personal data card comprising:
   a polymer thick-film circuit formed of a sheet of polymer film having a pattern of pads and interconnecting paths printed thereon with a conductive ink, each of a plurality of selected pads having a layer of nickel applied thereto and a layer of gold overlying the layer of nickel.
   at least one semiconductor die having a plurality of contacts each wire bonded by a lead to a corresponding one of said selected pads having nickel and then gold applied thereto; and
   at least one additional layer laminated to the polymer thick-film circuit.

11. The personal data card according to claim 10 wherein conductive ink printed on the polymer film comprises a copper-loaded polymer ink.

12. The personal data card according to claim 10 further including a coil attached to the polymer film for coupling ac into the card.

13. The personal data card according to claim 10 further including a stiffening layer laminated to a first surface of the polymer film and front and back labels laminated to the stiffening layer and to the opposite surface of the film, respectively.

* * * * *